United States Patent [19]

Jinbo

[11] Patent Number: 5,126,662
[45] Date of Patent: Jun. 30, 1992

[54] METHOD OF TESTING A SEMICONDUCTOR CHIP

[75] Inventor: Syu Jinbo, Yokohama, Japan

[73] Assignee: Tokyo Electron Limited, Tokyo, Japan

[21] Appl. No.: 625,426

[22] Filed: Dec. 11, 1990

[30] Foreign Application Priority Data

Dec. 29, 1989 [JP] Japan .................. 1-341139

[51] Int. Cl.$^5$ .............. G01R 31/26; B23K 26/00
[52] U.S. Cl. .............. 324/158 P; 324/731; 324/158 R; 219/121.85
[58] Field of Search .............. 324/73.1, 158 R, 158 D, 324/158 P, 536, 537, 693, 501; 437/8; 219/121.12, 121.18, 121.6, 121.7, 121.85, 121.68, 121.7, 1121.71

[56] References Cited

U.S. PATENT DOCUMENTS

| 4,103,228 | 7/1978 | Ham .................. 324/158 P |
| 4,242,152 | 12/1980 | Stone .................. 219/121.85 |
| 4,764,485 | 8/1988 | Loughran et al. .................. 219/121.67 |
| 4,785,157 | 11/1988 | Gofuku et al. .................. 219/121.85 |
| 4,855,673 | 8/1989 | Todokoro .................. 324/158 R |
| 4,906,491 | 3/1990 | Yamazaki .................. 219/121.67 |
| 4,921,810 | 5/1990 | Kunieda et al. .................. 324/158 R |
| 4,978,923 | 12/1990 | Maltiel .................. 324/158 R |

Primary Examiner—Vinh Nguyen
Attorney, Agent, or Firm—Oblon, Spivak, McClelland, Maier & Neustadt

[57] ABSTRACT

The electrical characteristics of a semiconductor chip having a wiring layer covered with a passivation film are tested by a prober with a probe. First, part of the wiring layer, which is to be electrically connected to the probe, is selected. An opening is then formed by a laser beam in the passivation film, which corresponds to the part of the wiring layer, so as to reach down to a surface of the part of the wiring layer, and thus the part of the wiring layer is exposed. The wavelength of the laser beam is 0.7 μm or less and supplied as a pulse. The depth of the opening is controlled by the number of pulses. Next the probe is inserted into the opening to bring it into electrical contact with the part of the wiring layer. In this manner, the electrical characteristics of the semiconductor chip are tested.

10 Claims, 2 Drawing Sheets

METHOD OF TESTING A SEMICONDUCTOR CHIP

BACKGROUND OF THE INVENTION

1. Field of the Invention

The present invention relates to a method of testing a semiconductor chip and, more specifically, to a method of testing electrical characteristics of a semiconductor chip such as a passivated IC chip.

2. Description of the Related Art

In a conventional method of testing electrical characteristics of an IC chip, the characteristics are detected using a test IC chip or a test wafer which is assembled without a passivation treatment. On the contrary, the electrical characteristics of a passivated IC chip or wafer are conventionally tested by removing a passivation film formed thereon by plasma etching or the like.

When an assembled IC is defective, usually, its IC chip is tested by entirely removing a passivation film of the IC chip and then bringing a probe of a manual prober into contact with a micro pattern, thereby to find a defect.

There does not occur any problem in testing an IC chip on which no passivation film is formed. However, when an IC chip on which a passivation film is formed is tested, all the passivation film other than the part to be tested needs to be removed, thus increasing the number of testing steps. Since a wiring layer or aluminum pattern 2 formed on IC chip 1 is tested by putting minute probe 3 having a small capacitance into contact with aluminum pattern 2 as shown in FIG. 1, probe 3 slips out of aluminum pattern 2 and therefore a stable inspection cannot be performed. Furthermore, the electrical characteristics of an IC itself are varied by entirely removing the passivation film.

SUMMARY OF THE INVENTION

The present invention has been made in consideration of the above situation and its object is to provide a method of testing a semiconductor chip which reduces a useless process and enables a quick and reliable operation. The object can be attained by the following methods of testing a semiconductor chip.

According to the first aspect of the present invention, there is provided a method of testing electrical characteristics of a semiconductor chip having a conductive layer covered with a passivation film by a prober with a probe, comprising the steps of: selecting part of the conductive layer which is to be electrically connected to the probe; forming an opening in the passivation film covering the part of the conductive layer by a laser beam so as to reach down to a surface of the part of the conductive layer; and inserting the probe into the opening to bring the probe into electrical contact with the part of the conductive layer.

According to the second aspect of the present invention there is provided a method of testing electrical characteristics of a multi-conductive-layered type semiconductor chip having an upper conductive layer covered with a passivation film and a lower conductive layer covered with an interlayer insulating film by a prober with a probe, comprising the steps of: selecting part of the lower conductive layer which is to be electrically connected to the probe, the part being selected so as not to overlap the upper conductive layer; forming an opening in the passivation film and interlayer insulating film covering the part of the lower conductive layer by a laser beam so as to reach down to a surface of the part of the lower conductive layer; and inserting the probe into the opening to bring the probe into electrical contact with the part of the lower conductive layer.

According to the third aspect of the present invention, there is provided a method of testing electrical characteristics of a multi-conductive-layered type semiconductor chip having an upper conductive layer covered with a passivation film and a lower conductive layer covered with an interlayer insulating film by a prober with a probe, comprising the steps of: selecting part of the lower conductive layer which is to be electrically connected to the probe, the part being selected so as to overlap the upper conductive layer; forming an opening in the passivation film, upper conductive layer, and interlayer insulating film covering the part of the lower conductive layer by a laser beam so as to reach down to surface of the part of the lower conductive layer, and an inner wall of the opening being substantially at a right angle to an upper surface of the lower conductive layer; and inserting the probe into the opening to bring the probe into electrical contact with the part of the lower conductive layer.

In the preferred embodiments of the present invention described later, the laser beam whose wavelength is not more than 0.7 $\mu$m is supplied as a pulse, and the depth of the opening is controlled by the number of pulses.

According to the present invention, to test part of an object such as a passivated IC chip, a passivation film corresponding to the position of the part is removed by a laser beam to form an opening having a diameter of, e.g., 0.3 to 2 $\mu$m. The opening can be formed in the atmosphere.

A waveform from the IC chip can be quickly tested by bringing a probe having a small capacitance of 1 $\mu$F or less into contact with a conductive layer, such as an aluminum pattern, in the IC chip through the opening. The opening prevents the probe from slipping out of the aluminum pattern and also prevents the probe from being influenced by external vibration. Therefore, the probe can be stably and reliably brought into contact with the aluminum pattern.

In an IC chip having a multi-conductive-layered structure, a conductive layer formed under an interlayer insulating film, which was conventionally difficult to test, can be tested by the method according to the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
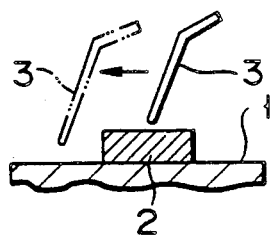
FIG. 1 is a partially sectional view showing a conventional method of testing an IC chip in which a probe is brought into contact with the IC chip.
Figure 2:
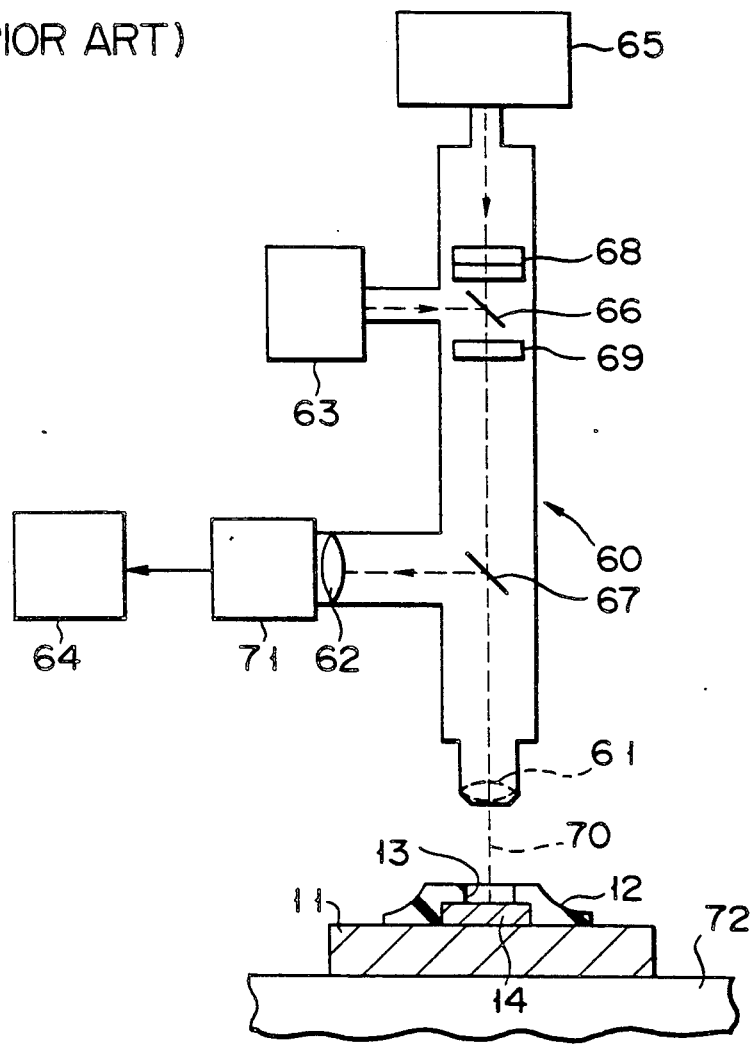
FIG. 2 is a schematic view showing a laser apparatus for executing a method of testing an IC chip according to the present invention.

As illustrated in FIG. 2, IC chip (object to be tested) 11 is coated with passivation film 12 for its protection. Passivation film 12 is a silicon nitride film, a silicon oxide film, a phosphorus silicate glass (PSG) film, a resin film such as polyamide, or the like. The passivation film prevents IC chip 11 from being contaminated with moisture, metal ion, chemical material such as corrosive gas and from being mechanically damaged. Further, dust or the like is prevented from being attached to the IC chip.

There is a case where electrical characteristics of part of IC chip 11 are tested after passivation film 12 is formed. In this case, opening 13 is formed at selected part of passivation film 12 by a laser beam from laser apparatus 60 shown in FIG. 2 so as to expose a conductive layer, such as wiring layer 14, and the electrical characteristics are tested through the opening.

As illustrated in FIG. 2, IC chip 11 is placed on X-Y stage 72 having a position adjusting function. A microscope comprises objective lens 61 and eyepiece 62. Light emitted from light source 63 is reflected by mirror 66 and guided to a predetermined position on IC chip 11 through objective lens 61. A position on the chip irradiated with the laser beam can thus be determined using the light emitted from light source 63. The light is reflected by the upper surface of chip 11, then reflected by mirror 67 and guided to monitor 64 through an image pickup device such as CCD camera 71. Therefore, an image of the surface of the IC chip is displayed on monitor 64.

Laser apparatus 60 also comprises laser oscillator 65, damping filter 68, and aperture stop 69. An Nd-Yag laser, an Ar laser or the like, which can form opening 13, is used as laser oscillator 65.

As described above, the passivation film is formed of an insulating material such as $SiO_2$ (glass) and its thickness is about 1 μm. The laser beam irradiating the IC chip is easy to be absorbed into the passivation film. The laser beam is output as a pulse a predetermined number of times at a predetermined intensity to remove part of the passivation film, thus forming an opening therein.

The laser beam differs in intensity and wavelength from the conventional laser beam which has been used for cutting an aluminum wiring layer formed in an IC chip and is used only to cut the passivation film formed on the surface of the IC chip. It is desirable that the wavelength of the laser beam is 0.7 μm or less. In the embodiments of the present invention, the wavelength of the laser beam is about 0.532 μm.

Figure 3:
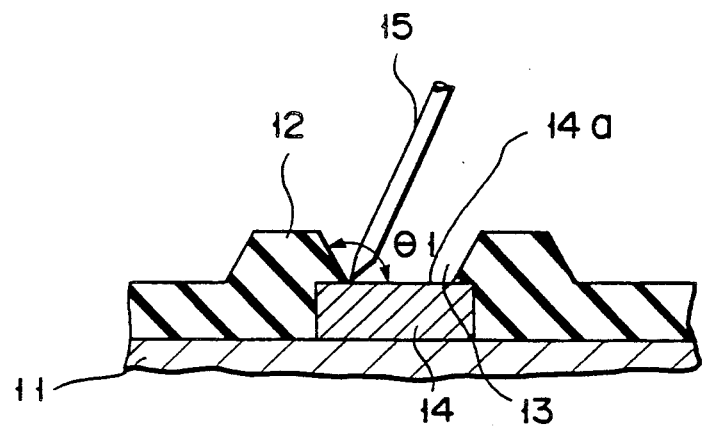
FIGS. 3 to 5 are partially enlarged sectional views showing methods of testing an IC chip according to the first to third embodiments of the present invention.
Figure 4:
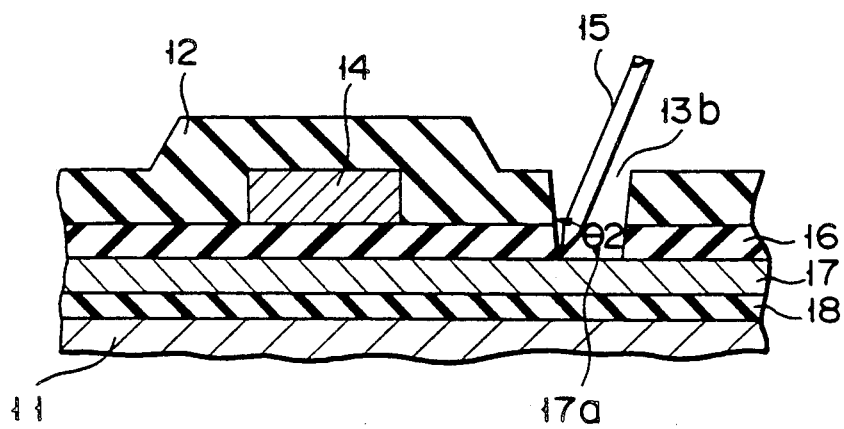
Figure 5:
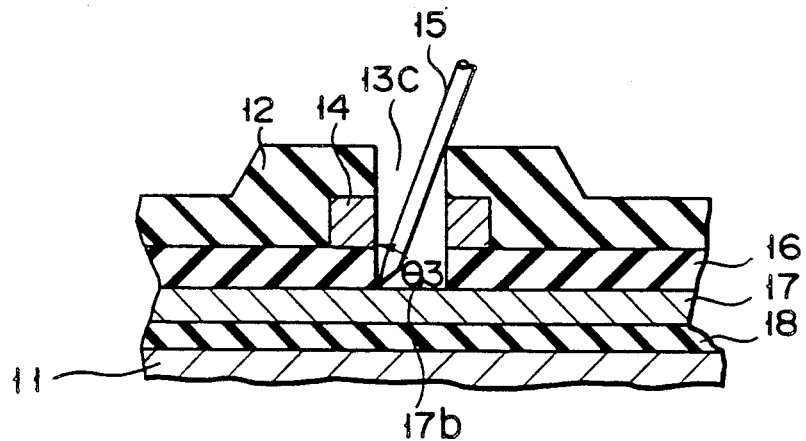

Table 1 shows the specification of the laser beam (irradiating from laser apparatus 60 shown in FIG. 2) used in the embodiments illustrated in FIGS. 3 to 5. Table 2 shows the relationship between the type of the passivation film and the conditions for applying the laser beam shown in Table 1 to the IC chip.

TABLE 1

| Items | Specification |
|---|---|
| Output Characteristics | |
| Oscillation Frequency | 532 nm |
| Laser Output | 2 mj/pulse |
| Pulse Width | 4 nsec |
| Peak Power | 0.5 MW |
| Beam Characteristics | |
| Beam Diameter | 2 mmφ |
| Diffusion Angle | 3 mrad or less (total angle) |
| Polarization | straight |
| Operating Condition | |
| Number of Repeated Pulses | 1 Hz or less |

TABLE 2

| Film | | Laser Beam | | |
|---|---|---|---|---|
| Type | Thickness | Space Filter | Transmittance | Number of pulses |
| $SiO_2$ | 1 μm | 100 μm | 0.02 | 1 |
| polyamide | 1 μm | 400 μm | 0.35 | 2 |

FIG. 3 is a partially enlarged sectional view showing a method of testing an IC chip according to the first embodiment of the present invention. According to the first embodiment, part 14a of conductive layer or wiring layer 14 which is formed on chip 11 and it to be electrically connected to probe 15, is selected. Opening 13 is then formed by a laser beam in passivation film 12 so as to reach down to the surface of wiring layer 14 and thus part 14a is exposed. Probe 15 is inserted into opening 13 to bring it into electrical contact with part 14a of wiring layer 14. A predetermined electrical characteristic of the IC chip is tested by a prober having probe 15.

According to the method of the first embodiment using the laser beam shown in FIG. 2, an object to be tested, i.e., part 14a of the wiring layer is positioned by the light emitted from light source 63 while viewing the upper surface of IC chip 11 from monitor 64. Laser beam 70 is output from laser oscillator 65, and the intensity of the laser beam is adjusted by damping filter 68 and the diameter of the laser beam is adjusted by aperture stop 69. Opening 13 0.3 to 2 μm square can thus be formed.

As shown in FIG. 3, probe 15 having a small capacitance of 1 μF or less is put into contact with part 14a through opening 13 to test the electrical characteristics of the IC chip such as a waveform. Since probe 15 contacts part 14a in opening 13, it neither deviates from nor slips out of the wiring layer. Therefore, the contact therebetween is very stable. Further, since opening 13 is small, the probe can be prevented from being influenced by the external vibration when the electrical characteristics are tested. This is because probe 15 can be held by the inner wall of opening 13 formed in passivation film 12 so as to surround an end portion of the probe.

To reliably hold probe 15, it is desirable that angle θ1 of the side wall of opening 13 to the surface of wiring layer 14 is 135 degrees or less. If the angle is too large, probe 15 is caused to slip out of the wiring layer.

FIG. 4 is a partially enlarged sectional view showing a method of testing an IC chip according to the second embodiment of the present invention. Semiconductor chip 11 shown in FIG. 4 is of a multi-conductive-layered type or multi-layered wiring type. Lower wiring layer 17 is formed on chip 11 with interlayer insulating film 18 interposed therebetween. Another interlayer insulating film 16 is formed on layer 17. Upper wiring layer 14 is formed on interlayer insulating film 16 and covered with passivation film 12.

In the second embodiment, part 17a of lower wiring layer 17 to be electrically connected to probe 15, that is, part 17a which does not overlap upper wiring layer 14 is selected. Then opening 13b is formed by a laser beam in both passivation film 12 and interlayer insulating film 16 so as to reach down to the surface of lower wiring layer 17 and thus part 17a is exposed. Probe 15 is inserted into opening 13b to bring it into electrical contact with part 17a of lower wiring layer 17. A predetermined electrical characteristic of the IC chip is tested by a prober having probe 15.

As shown in FIG. 4, it is desirable that angle θ2 of the side wall of opening 13b to the surface of wiring layer 17 is smaller than angle θ1 shown in FIG. 3 and 115 degrees or less. Since the wiring layers are formed with high density, if angle θ2 is too large, part of the upper wiring layer will be undesirably exposed, which causes a short circuit between the wiring layers.

FIG. 5 is a partially enlarged sectional view showing a method of testing an IC chip according to the third embodiment of the present invention. Semiconductor chip 11 shown in FIG. 5 is of the same multi-layered wiring type as that of the semiconductor chip shown in FIG. 4. In FIG. 5, the same components as those in FIG. 4 are denoted by the same reference numerals.

In the third embodiment, part 17b of lower wiring layer 17 to be electrically connected to probe 15, that is, part 17a which overlaps upper wiring layer 14 is selected. Then opening 13c is formed by a laser beam in passivation film 12, upper wiring layer 14, and interlayer insulating film 16 so as to reach down to the surface of lower wiring layer 17 and thus part 17b is exposed. Probe 15 is inserted into opening 13c to bring it into electrical contact with part 17b of lower wiring layer 17. A predetermined electrical characteristic of the IC chip is tested by a prober having probe 15.

As shown in FIG. 5, it is desirable that angle θ3 of the side wall of opening 13c to the surface of wiring layer 17 is much smaller than angle θ2 shown in FIG. 4 and substantially 90 degrees. If angle θ3 is too large, part of upper wiring layer 14 will be undesirably cut or probe 15 will be caught on upper wiring layer 14 and thus connected to only wiring layer 14, which causes an error in inspection.

The present invention is not limited to the above embodiments but applicable to all semiconductor chips in which a passivation film is formed on a conductive layer.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of testing an electrical characteristic of an IC chip internal wiring layer covered with a passivation film by placing a probe in contact with said wiring layer, said method comprising the steps of:

positioning said IC chip such that a portion of said passivation film on part of said internal wiring layer which is to be electrically connected to said probe is situated at a laser beam irradiation position;

irradiating said passivation film with a laser beam so as to form an opening which reaches down to a surface of said part of said internal wiring layer;

inserting said probe into said opening to place said probe in electrical contact with said part of said internal wiring layer; and checking the electrical characteristic of said internal wiring layer by said probe.

2. The method according to claim 1, wherein an angle of a side wall of said opening to an upper surface of said internal wiring layer is 135 degrees or less.

3. The method according to claim 2, wherein a wavelength of said laser beam is 0.7 μm or less.

4. The method according to claim 3, wherein said laser beam is supplied as a pulse, and a depth of said opening is controlled by the number of pulses.

5. A method of testing an electrical characteristic of a lower internal wiring layer of an IC chip which has an upper internal wiring layer covered with a passivation film and said lower internal wiring layer covered with an interlayer insulating film, by placing a probe in contact with said lower internal wiring layer, said method comprising the steps of:

positioning said IC chip such that a portion of said passivation film above part of said lower internal wiring layer which is to be electrically connected to said probe is situated at a laser beam irradiation position, said part being selected so as not to overlap said upper internal wiring layer;

irradiating said passivation film and said interlayer insulating film with a laser beam so as to form an opening which reaches down to a surface of said part of said lower internal wiring layer;

inserting said probe into said opening to place said probe in electrical contact with said part of said lower internal wiring layer; and checking the electrical characteristic of said internal wiring layer by said probe.

6. The method according to claim 5, wherein a wavelength of said laser beam is 0.7 μm or less.

7. The method according to claim 6, wherein said laser beam is supplied as a pulse, and a depth of said opening is controlled by the number of pulses.

8. A method of testing an electrical characteristic of a lower internal wiring layer of an IC chip which has an upper internal wiring layer covered with a passivation film and said lower internal wiring layer covered with an interlayer insulating film, by placing a probe in contact with said lower internal wiring layer, said method comprising the steps of:

positioning said IC chip such that a portion of said passivation film above part of said lower internal wiring layer which is to be electrically connected to said probe is situated at a laser beam irradiation position, said part being selected so as to overlap said upper internal wiring layer;

irradiating said passivation film, said upper internal wiring layer, and said interlayer insulating film with a laser beam so as to form an opening which reaches down to a surface of said part of said lower internal wiring layer; the inner wall of said opening being substantially at a right angle to an upper surface of said lower internal wiring layer;

inserting said probe into said opening to place said probe in electrical contact with said part of said lower internal wiring layer; and checking the electrical characteristic of said internal wiring layer by said probe.

9. The method according to claim 8, wherein a wavelength of said laser beam is 0.7 μm or less.

10. The method according to claim 9, wherein said laser beam is supplied as a pulse, and a depth of said opening is controlled by the number of pulses.

* * * * *